United States Patent
Ariga et al.

(10) Patent No.: US 12,513,900 B2
(45) Date of Patent: Dec. 30, 2025

(54) SEMICONDUCTOR DEVICE AND SEMICONDUCTOR DEVICE MANUFACTURING METHOD

(71) Applicant: Kioxia Corporation, Tokyo (JP)

(72) Inventors: Tomotaka Ariga, Yokkaichi (JP); Masayuki Kitamura, Yokkaichi (JP); Hiroshi Toyoda, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 569 days.

(21) Appl. No.: 17/643,717

(22) Filed: Dec. 10, 2021

(65) Prior Publication Data

US 2023/0088700 A1 Mar. 23, 2023

(30) Foreign Application Priority Data

Sep. 21, 2021 (JP) .................................. 2021-152938

(51) Int. Cl.
*H10B 43/27* (2023.01)
*H10D 64/01* (2025.01)
*H10D 64/66* (2025.01)

(52) U.S. Cl.
CPC .......... *H10B 43/27* (2023.02); *H10D 64/037* (2025.01); *H10D 64/665* (2025.01)

(58) Field of Classification Search
CPC .. H10B 43/27; H01L 29/40117; H01L 29/495
USPC ....................................................... 257/324
See application file for complete search history.

(56) References Cited

U.S. PATENT DOCUMENTS

| | | | |
|---|---|---|---|
| 5,378,649 A * | 1/1995 | Huang | H10B 20/00 438/278 |
| 8,432,730 B2 | 4/2013 | Uochi et al. | |
| 9,177,808 B2 | 11/2015 | Purayath et al. | |
| 9,406,694 B1 | 8/2016 | Ikeno et al. | |
| 2002/0137336 A1 * | 9/2002 | Won | C23C 16/42 438/683 |
| 2017/0263621 A1 * | 9/2017 | Wakatsuki | H10B 43/27 |
| 2019/0279932 A1 * | 9/2019 | Wakatsuki | H10B 43/27 |
| 2020/0273868 A1 * | 8/2020 | Chen | H01L 21/76889 |
| 2021/0066468 A1 | 3/2021 | Beppu et al. | |

FOREIGN PATENT DOCUMENTS

| | | |
|---|---|---|
| JP | 2002-313748 A | 10/2002 |
| JP | 2021-34591 A | 3/2021 |

* cited by examiner

*Primary Examiner* — Ori Nadav
(74) *Attorney, Agent, or Firm* — Oblon, McClelland, Maier & Neustadt, L.L.P.

(57) ABSTRACT

A semiconductor device that can have an improved data retention characteristic is provided. A semiconductor device includes a stacked body and a memory pillar formed in a memory hole of the stacked body. The memory pillar has a structure in which a semiconductor portion 61*b*, a tunnel insulating film 62*a*, and a charge storage layer 62*b* are sequentially stacked. A block insulating film 53 is provided between the charge storage layer 62*b* and a conductive layer 52. The conductive layer 52 contains molybdenum. The block insulating film 53 includes a silicon oxide film 53*a* and an aluminum oxide film 53*b*. A region from the conductive layer 52 to the aluminum oxide film 53*b* contains chlorine, which prevents OH diffusion. The concentration of chlorine at a second portion closer to the aluminum oxide film 53*b* than a first portion in the conductive layer 52 is higher than the concentration of impurities at the first portion in the conductive layer.

13 Claims, 17 Drawing Sheets

SEMICONDUCTOR DEVICE AND SEMICONDUCTOR DEVICE MANUFACTURING METHOD

CROSS-REFERENCE TO RELATED APPLICATION

This application is based upon and claims the benefit of priority from the prior Japanese Patent Applications No. 2021-152938, filed on Sep. 21, 2021, the entire contents of which are incorporated herein by reference.

FIELD

Embodiments relate to a semiconductor device and a semiconductor device manufacturing method.

BACKGROUND

A semiconductor device such as a NAND flash memory includes a substrate and a stacked body provided above the substrate. The stacked body has a configuration in which conductive layers and insulator layers are alternately stacked. A plurality of memory holes are formed through the stacked body. In each memory hole, a core portion, a semiconductor portion, a tunnel insulating film, and a charge storage layer are sequentially stacked from a central part of the memory hole to the outside. Block insulating films are provided between each conductive layer and the corresponding insulator layer and between a conductive layer and the charge storage layer, respectively.

DETAILED DESCRIPTION

Figure 1:
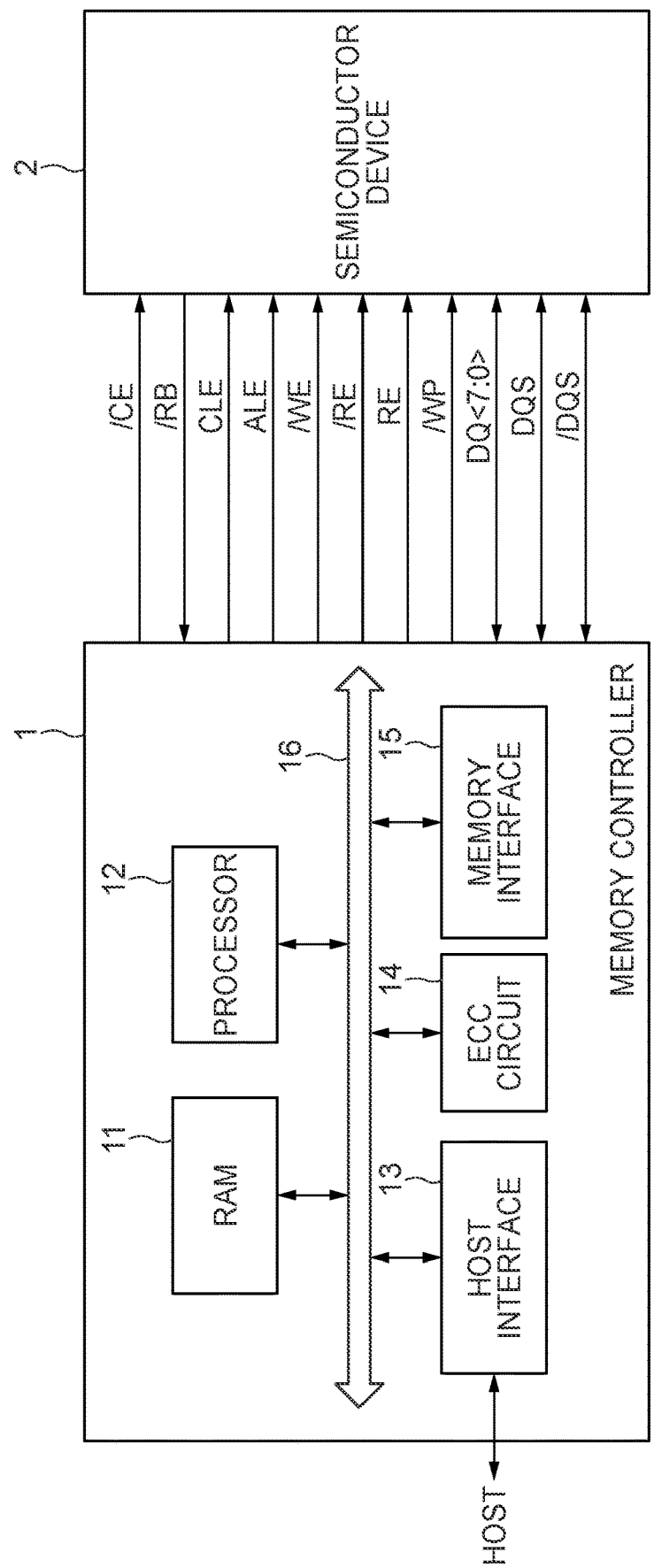
FIG. 1 is a block diagram showing a schematic configuration of a memory system of an embodiment.

Embodiments will be described below with reference to the accompanying drawings. To facilitate understanding of description, any identical components in the drawings are denoted by the same reference sign as much as possible, and duplicate description thereof is omitted.

1. Embodiment

1.1 Configuration of Memory System

As shown in FIG. 1, a memory system of the present embodiment includes a memory controller 1 and a semiconductor device 2. The semiconductor device 2 is a nonvolatile storage configured as a NAND flash memory. The memory system is connectable to a host. The host is an electronic device such as a personal computer or a portable terminal. Note that although only one semiconductor device 2 is shown in FIG. 1, a plurality of semiconductor devices 2 are provided in an actual memory system.

The memory controller 1 controls writing of data to the semiconductor device 2 in accordance with a writing request from the host. The memory controller 1 also controls reading of data from the semiconductor device 2 in accordance with a reading request from the host.

Signals such as a chip-enable signal /CE, a ready/busy signal /RB, a command-latch enable signal CLE, an address-latch enable signal ALE, a write enable signal /WE, read enable signals RE, /RE, a write protect signal /WP, a data signal DQ <7:0>, and data strobe signals DQS, /DQS are to be transmitted and received between the memory controller 1 and the semiconductor device 2.

The chip-enable signal /CE is a signal for enabling the semiconductor device 2. The ready/busy signal /RB is a signal for indicating whether the semiconductor device 2 is in a ready state or in a busy state. The "ready state" refers to a state in which an external command is to be received. The "busy state" is a state in which no external command is to be received. The command-latch enable signal CLE is a signal indicating that the signal DQ <7:0> is a command. The address-latch enable signal ALE is a signal indicating that the signal DQ <7:0> is an address. The write enable signal /WE, which is a signal for taking a received signal into the semiconductor device 2, is to be asserted every time when the memory controller 1 receives a command, an address and data. The memory controller 1 instructs the semiconductor device 2 to take the signal DQ <7:0> while the signal /WE is a "L (Low)" level.

The read enable signals RE, /RE are signals from the memory controller 1 to read data from the semiconductor device 2. The read enable signals RE, /RE are used for, for example, controlling an operation timing of the semiconductor device 2 for outputting the signal DQ <7:0>. The write protect signal /WP is a signal for providing instructions of inhibition of writing and erasure of data to the semiconductor device 2. The signal DQ <7:0> is an entity of data transmitted and received between the semiconductor device 2 and the memory controller 1, which includes a command, an address and data. The data strobe signals DQS, /DQS are signals for controlling a timing for input and output of the signal DQ <7:0>.

The memory controller 1 includes a RAM 11, a processor 12, a host interface 13, an ECC circuit 14, and a memory interface 15. The RAM 11, the processor 12, the host interface 13, the ECC circuit 14, and the memory interface 15 are connected to each other through an internal bus 16.

The host interface 13 outputs a request, user data (write data), etc., received from the host to the internal bus 16. The host interface 13 also transmits user data read from the semiconductor device 2, a response from the processor 12, etc., to the host.

The memory interface 15 controls, on the basis of instructions from the processor 12, a process of writing user data or the like to the semiconductor device 2 and a process of reading user data or the like from the semiconductor device 2.

The processor 12 collectively controls the memory controller 1. The processor 12 is, for example, a CPU or an MPU. The processor 12 performs, in response to receiving a request from the host through the host interface 13, a control in accordance with the request. For example, the processor 12 instructs the memory interface 15 to write user data and parity to the semiconductor device 2 in accordance with the request from the host. The processor 12 also instructs the memory interface 15 to read user data and parity from the semiconductor device 2 in accordance with the request from the host.

The processor 12 determines a storage region (a memory region) on the semiconductor device 2 for user data accumulated in the RAM 11. The user data is held in the RAM 11 through the internal bus 16. The processor 12 determines the memory region for data (page data) per writing unit, i.e., per page. User data held in one page in the semiconductor device 2 is hereinafter also referred to as "unit data". The unit data is usually encoded and held in the semiconductor device 2 as a code word. In the present embodiment, encoding is not essential. Although the memory controller 1 may hold the unit data in the semiconductor device 2 without encoding the unit data, a configuration in which encoding is performed is shown as an example in FIG. 1. In a case in which the memory controller 1 does not perform encoding, page data matches with unit data. One code word may be generated on the basis of one piece of unit data, or one code word may be generated on the basis of divided data provided by dividing unit data. Alternatively, one code word may be generated by using a plurality of pieces of unit data.

The processor 12 determines a writing destination, i.e., a memory region on the semiconductor device 2, for each unit data. Each memory region on the semiconductor device 2 is assigned with a physical address. With use of the physical address, the processor 12 manages the memory region, which is a destination for the unit data to be written. The processor 12 instructs the memory interface 15 to write the user data to the semiconductor device 2 with the determined memory region (physical address) designated. The processor 12 manages correspondence between a logical address (a logical address managed by the host) and the physical address of the user data. In a case of receiving a reading request including a logical address from the host, the processor 12 identifies the physical address corresponding to the logical address and instructs the memory interface 15 to read the user data with the physical address designated.

The ECC circuit 14 encodes user data held in the RAM 11, thereby generating a code word. The ECC circuit 14 decodes a code word read from the semiconductor device 2.

The RAM 11 temporary holds user data received from the host until the user data is stored in the semiconductor device 2 and temporary holds data read from the semiconductor device 2 until the data is transmitted to the host. The RAM 11 is, for example, a general-purpose memory such as an SRAM or a DRAM.

FIG. 1 shows a configuration example where the memory controller 1 includes both the ECC circuit 14 and the memory interface 15. However, the ECC circuit 14 may be incorporated in the memory interface 15. Alternatively, the ECC circuit 14 may be incorporated in the semiconductor device 2. Specific configurations and locations of the components shown in FIG. 1 are not limitative.

In a case of receiving a writing request the host, the memory system in FIG. 1 operates as follows. The processor 12 causes the RAM 11 to temporarily store data to write. The processor 12 reads the data stored in the RAM 11 and inputs the data to the ECC circuit 14. The ECC circuit 14 encodes the input data and inputs a code word to the memory interface 15. The memory interface 15 writes the input code word to the semiconductor device 2.

In a case of receiving a reading request from the host, the memory system in FIG. 1 operates as follows. The memory interface 15 inputs a code word read from the semiconductor device 2 to the ECC circuit 14. The ECC circuit 14 decodes the input code word and causes the RAM 11 to store the decoded data. The processor 12 transmits the data stored in the RAM 11 to the host through the host interface 13.

1.2 Configuration of Semiconductor Device

Figure 2:
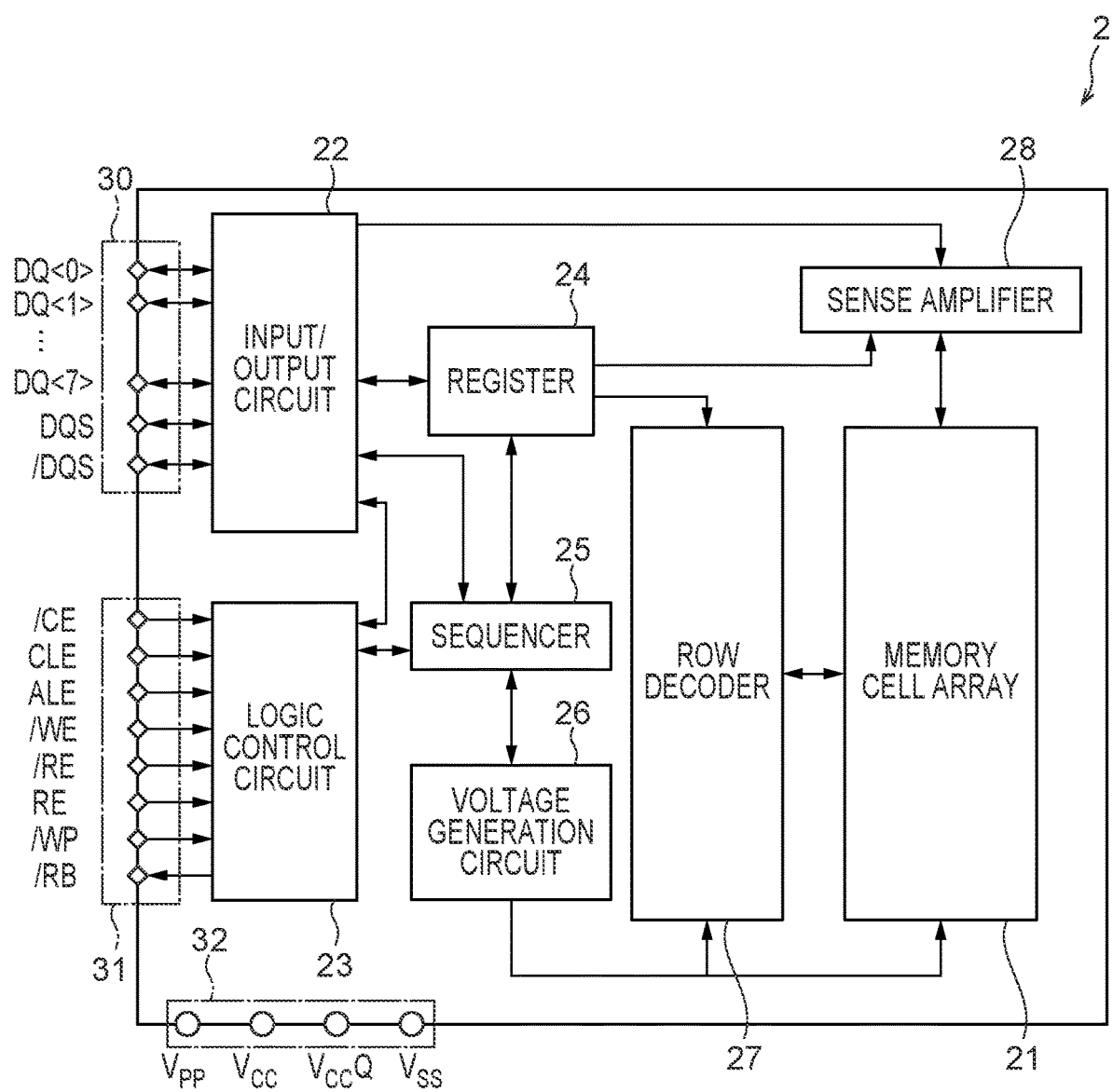
FIG. 2 is a block diagram showing a schematic configuration of a semiconductor device of the embodiment.

As shown in FIG. 2, the semiconductor device 2 includes a memory cell array 21, an input/output circuit 22, a logic control circuit 23, a register 24, a sequencer 25, a voltage generation circuit 26, a row decoder 27, a sense amplifier 28, a pad group for input/output 30, a pad group for logic control 31, and a terminal group for power input 32.

The memory cell array 21 is a section that stores data. The memory cell array 21 includes a plurality of memory cell transistors associated with a plurality of bit lines and a plurality of word lines.

The signal DQ <7:0> and the data strobe signals DQS, /DQS are transmitted and received between the input/output circuit 22 and the memory controller 1. The input/output circuit 22 also forwards a command and an address in the signal DQ <7:0> to the register 24. In addition, write data and read data are transmitted and received between the input/output circuit 22 and the sense amplifier 28.

The logic control circuit 23 receives the chip-enable signal /CE, the command-latch enable signal CLE, the address-latch enable signal ALE, the write enable signal /WE, the read enable signals RE, /RE, and the write protect signal /WP from the memory controller 1. The logic control circuit 23 also forwards the ready/busy signal /RB to the memory controller 1, externally informing the state of the semiconductor device 2.

The register 24 temporarily holds various kinds of data. For example, the register 24 holds commands providing instructions for a writing operation, a reading operation, an erasure operation, and the like. The commands are input to the input/output circuit 22 from the memory controller 1 and then forwarded from the input/output circuit 22 to the register 24 to be held. The register 24 also holds an address corresponding to the above-described command. The address is input to the input/output circuit 22 from the memory controller 1 and then forwarded from the input/output circuit 22 to the register 24 to be held. The register 24 also holds status information indicating an operation state of the semiconductor device 2. The status information is updated by the sequencer 25 in accordance with an operation state of the memory cell array 21 or the like. The status information is output as a state signal from the input/output circuit 22 to the memory controller 1 at the request of the memory controller 1.

The sequencer 25 controls the operations of sections including the memory cell array 21 on the basis of a control signal input from the memory controller 1 to the input/output circuit 22 and the logic control circuit 23.

The voltage generation circuit 26 is a section that generates a voltage required for each of a writing operation, a reading operation and an erasure operation of data in the memory cell array 21. Examples of such a voltage include a voltage applied to each of the plurality of word lines and the plurality of bit lines in the memory cell array 21. The operation of the voltage generation circuit 26 is controlled by the sequencer 25.

The row decoder 27 is a circuit configured as a switch group for applying a voltage to each of the plurality of word lines in the memory cell array 21. The row decoder 27 receives a block address and a row address from the register 24, selects a block on the basis of the block address, and selects a word line on the basis of the row address. The row decoder 27 switches opening and closing of the switch group such that a voltage from the voltage generation circuit 26 is applied to the selected word line. The operation of the row decoder 27 is controlled by the sequencer 25.

The sense amplifier 28 is a circuit for adjusting a voltage applied to the bit lines in the memory cell array 21 and for reading the voltage of the bit lines and converting it to data. In reading data, the sense amplifier 28 acquires data read from the memory cell transistors in the memory cell array 21 to the bit lines and forwards the acquired read data to the input/output circuit 22. In data writing, the sense amplifier 28 forwards data, which is to be written through the bit lines, to the memory cell transistors. The operation of the sense amplifier 28 is controlled by the sequencer 25.

The pad group for input/output 30 is a section provided with a plurality of terminals (pads) for transmission and reception of the signals between the memory controller 1 and the input/output circuit 22. The terminals are provided individually corresponding one-to-one to the signal DQ <7:0> and the data strobe signals DQS, /DQS.

The pad group for logic control 31 is a section provided with a plurality of terminals for transmission and reception of the signals between the memory controller 1 and the logic control circuit 23. The terminals are individually provided corresponding one-to-one to the chip-enable signal /CE, the command-latch enable signal CLE, the address-latch enable signal ALE, the write enable signal /WE, the read enable signals RE, /RE, the write protect signal /WP, and the ready/busy signal /RB.

The terminal group for power input 32 is a section provided with a plurality of terminals for receiving application of voltages required for the operations of the semiconductor device 2. The voltages to be applied to the respective terminals include power source voltages Vcc, VccQ, and Vpp, and a grounding voltage Vss. The power source voltage Vcc, which is a circuit power source voltage externally given as an operation power source, is, for example, a voltage of 3.3 V approximately. The power source voltage VccQ is, for example, a voltage of 1.2 V. The power source voltage VccQ is a voltage that is to be used for transmission and reception of a signal between the memory controller 1 and the semiconductor device 2. The power source voltage Vpp, which is a power source voltage higher than the power source voltage Vcc, is, for example, a voltage of 12 V.

1.3 Electronic Circuit Configuration of Memory Cell Array

Figure 3:
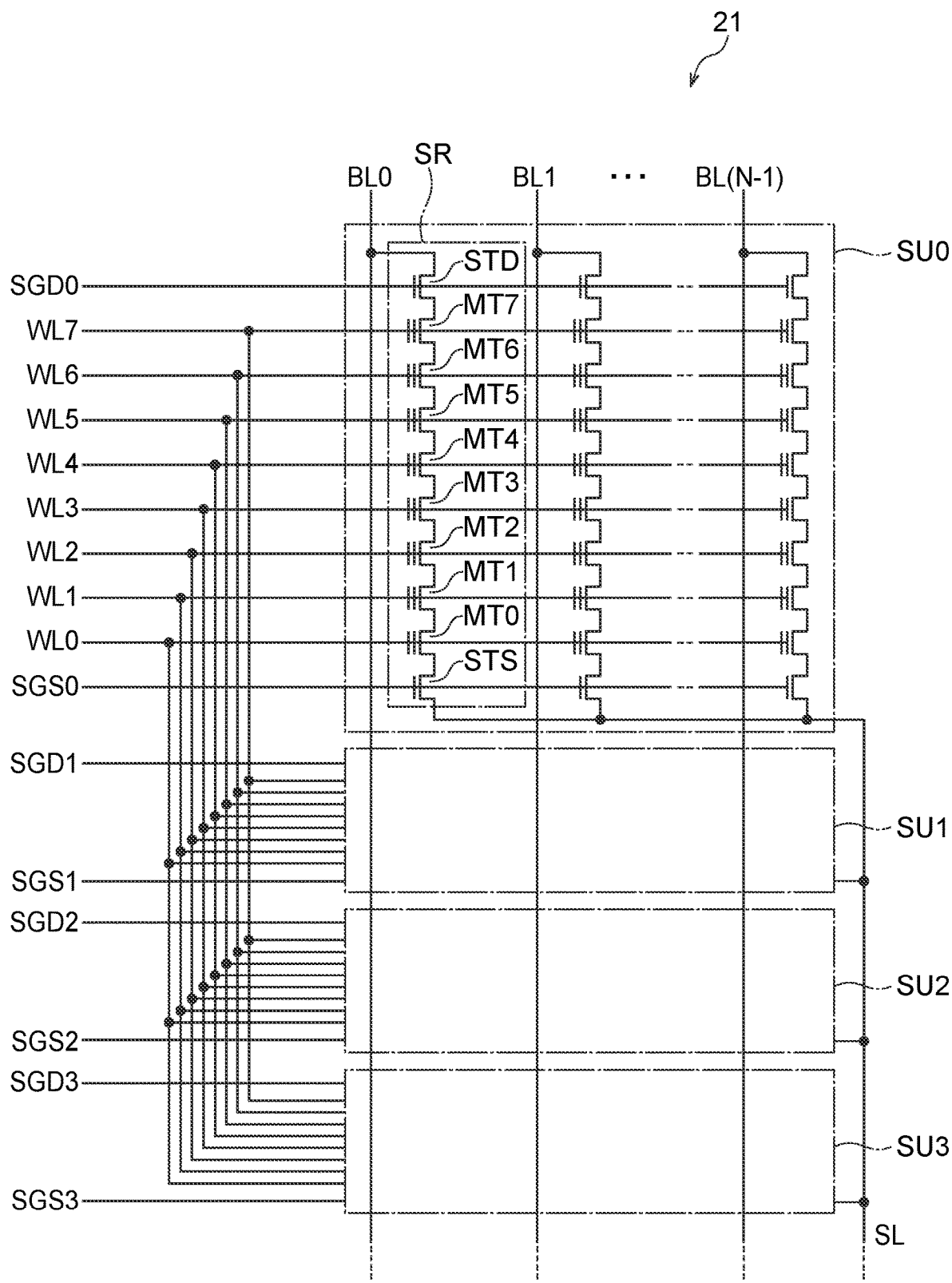
FIG. 3 is a circuit diagram showing an equivalent circuit of the semiconductor device of the embodiment.

Subsequently, an electronic circuit configuration of the memory cell array 21 will be described. As shown in FIG. 3, the memory cell array 21 includes a plurality of string units SU0 to SU3. The string units SU0 to SU3 each include a plurality of NAND strings SR. The NAND strings SR each include, for example, eight memory cell transistors MT0 to MT7 and two select transistors STD and STS. Note that the respective numbers of the memory cell transistors and the select transistors included in each of the NAND strings SR are optionally changeable.

The plurality of string units SU0 to SU3 are in the form of one block as a whole. Note that, in FIG. 3, only a single block is shown but the memory cell array 21 includes a plurality of such blocks in reality.

Hereinafter, the string units SU0 to SU3 are sometimes also referred to as "string units SU" without distinction. The memory cell transistors MT0 to MT7 are also referred to as "memory cell transistors MT" without distinction.

The memory cell array 21 includes N bit lines BL0 to BL(N−1). Note that "N" is a positive integer. The string units SU each include the same number of NAND strings SR as the number of N of the bit lines BL0 to BL(N−1). The memory cell transistors MT0 to MT7 provided to the NAND strings SR are arranged in series between a source of the select transistor STD and a drain of the select transistor STS. A drain of the select transistor STD is connected to one of the plurality of bit lines BL0 to BL(N−1). A source of the select transistor STS is connected to a source line SL. In the description below, the bit lines BL0 to BL(N−1) are sometimes also referred to as "bit lines BL" without distinction.

The memory cell transistors MT each are configured as a transistor having a charge storage layer at a gate portion. The amount of charges accumulated in the charge storage layer corresponds to data held in the memory cell transistors MT. The memory cell transistors MT may each be a charge-trap transistor including, for example, a silicon nitride film as the charge storage layer or a floating gate transistor including, for example, a silicon film as the charge storage layer.

Gates of the plurality of select transistors STD included in the string unit SU0 are all connected to the select gate line SGD0. A voltage for switching opening and closing of the select transistors STD is applied to the select gate line SGD0. Similarly, the string units SU1 to SU3 are connected to select gate lines SGD1 to SGD3, respectively.

Gates of the plurality of select transistors STS included in the string unit SU0 are all connected to a select gate line SGS0. A voltage for switching opening and closing of the select transistors STS is applied to the select gate line SGS0. Similarly, the string units SU1 to SU3 are connected to select gate lines SGS1 to SGS3, respectively. Note that the string units SU0 to SU3, which are in the form one block, may share a select gate line and the gates of the select transistors STS of the string units SU0 to SU3 may be connected to the select gate line in common.

Gates of the memory cell transistors MT0 to MT7 are connected to word lines WL0 to WL7. A voltage is applied to the word lines WL0 to WL7 for the purpose of switching opening and closing of the memory cell transistors MT0 to MT7, changing the amount of charges accumulated in the respective charge storage layers of the memory cell transistors MT0 to MT7, or the like.

Writing and reading of data in the semiconductor device 2 are collectively performed for each unit referred to as a "page" on the plurality of memory cell transistors MT connected to one of word lines WL in one of the string units SU. In contrast, erasure of data in the semiconductor device 2 is collectively performed on all the memory cell transistors MT included in the block. A variety of known methods are usable as specific methods for performing such writing, reading, and erasure of data, and accordingly, detailed description of the methods is omitted.

1.4 Structure of Semiconductor Device

Figure 4:
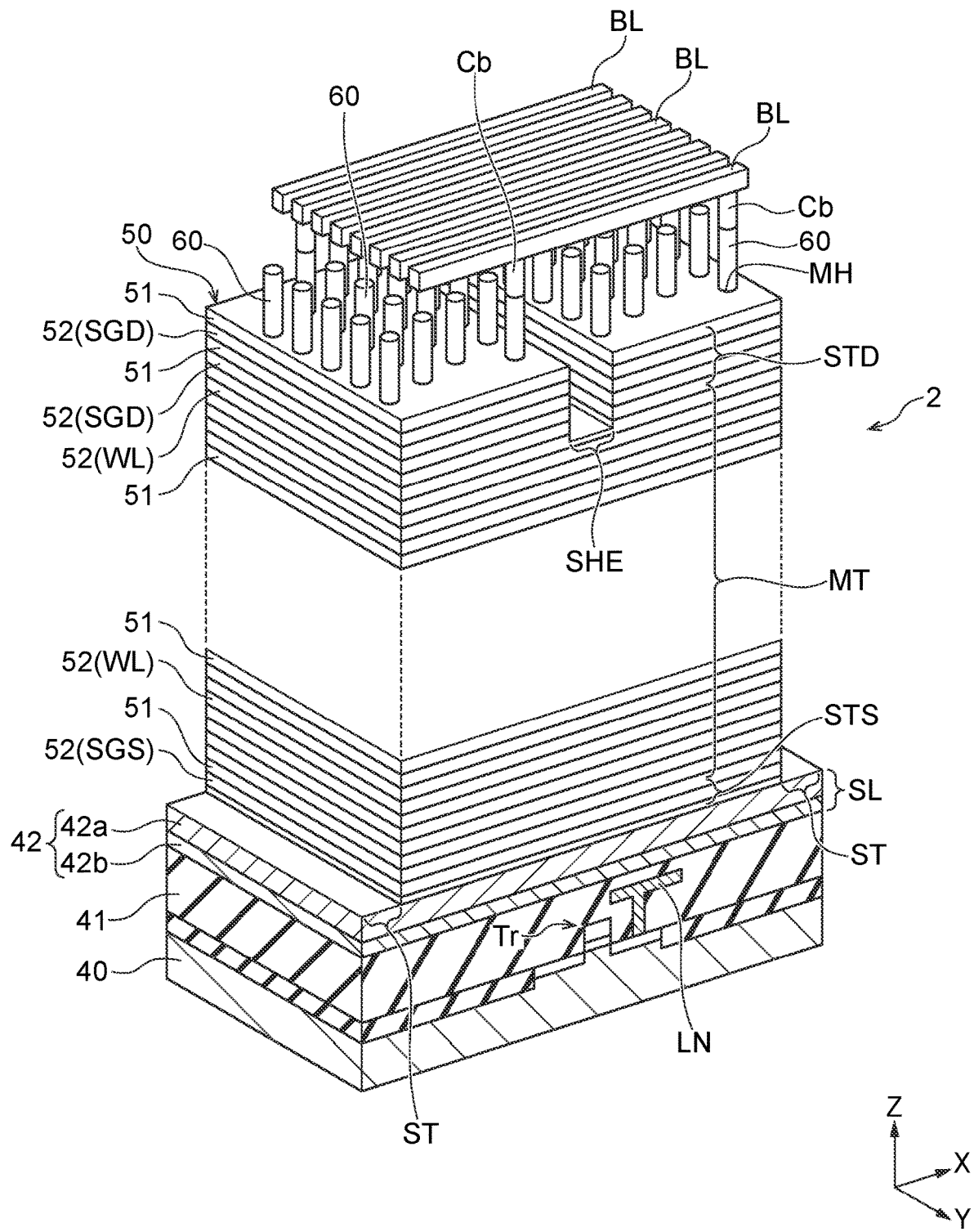
FIG. 4 is a perspective view showing a section perspective structure of the semiconductor device of the embodiment.

Subsequently, the structure of the semiconductor device 2, particularly, the structure of the vicinity of the memory cell array 21 will be specifically described. As shown in FIG. 4, the semiconductor device 2 includes a substrate 40, an insulator layer 41, a semiconductive layer 42, and a stacked body 50.

The substrate 40 is a plate-shaped member having a flat surface in a direction indicated by an arrow Z in the drawing. The substrate 40 is, for example, a silicon wafer. The insulator layer 41 and the semiconductive layer 42 are formed on the upper surface of the substrate 40 as a multi-layer film by, for example, CVD film formation.

Note that, in the description below, the direction indicated by the arrow Z is referred to as a "Z direction". In addition, a direction indicated by an arrow X and a direction indicated by an arrow Y in FIG. 4 are referred to as an "X direction" and a "Y direction", respectively. The X direction and the Y direction are directions orthogonal to each other and orthogonal to the Z direction. Note that, in the present embodiment, the Z direction corresponds to a predetermined direction.

The insulator layer 41 is formed of an insulating material such as silicon oxide. In the insulator layer 41, peripheral circuits including a transistor Tr, a wire LN, and the like are formed at a bottom part contacting the substrate 40. The peripheral circuits serve as the sense amplifier 28 and the row decoder 27 shown in FIG. 2. The peripheral circuits are entirely covered by the insulator layer 41.

The semiconductive layer 42 is a layer that functions as the source line SL in FIG. 3. The semiconductive layer 42 is formed of, for example, a silicon-containing material such as a polycrystalline silicon doped with impurities. The semiconductive layer 42 is embedded in the insulator layer 41 below the memory cell array 21.

Note that the semiconductive layer 42 may be entirely formed of a semiconductor material such as silicon but may be formed in a stacked structure of at least two layers including a semiconductive layer 42a and a conductive layer 22b as shown in FIG. 4. The semiconductive layer 42a is formed of a semiconductor material such as silicon. The conductive layer 22b is formed of a metallic material such as tungsten.

The stacked body 50 is provided on the upper surface of the semiconductive layer 42. The stacked body 50 has a structure in which a plurality of insulator layer 51 and a plurality of conductive layer 52 are alternately stacked in the Z direction. The insulator layers 51 and the conductive layers 52 are formed on the upper surface of the semiconductive layer 42 as a multi-layer film by, for example, CVD film formation.

The conductive layers 52 are conductive layers. The conductive layers 52 are formed of a molybdenum-containing material. The conductive layers 52 are used for the word lines WL0 to WL7, the select gate lines SGS1 and SGD1, and the like in FIG. 3.

The insulator layers 51 are each disposed between the conductive layers 52 and 52 adjacent to each other and electrically insulates the conductive layers. The insulator layers 51 are formed of, for example, a silicon-oxide-containing material.

A plurality of memory holes MH are formed to penetrate through the stacked body 50 in the Z direction. A memory pillar 60 is formed inside each memory hole MH. The memory pillars 60 are each formed in a region from one positioned uppermost among the insulator layers 51 to the semiconductive layer 42. The memory pillars 60 correspond one-to-one to a NAND string SR shown in FIG. 3.

Figure 5:
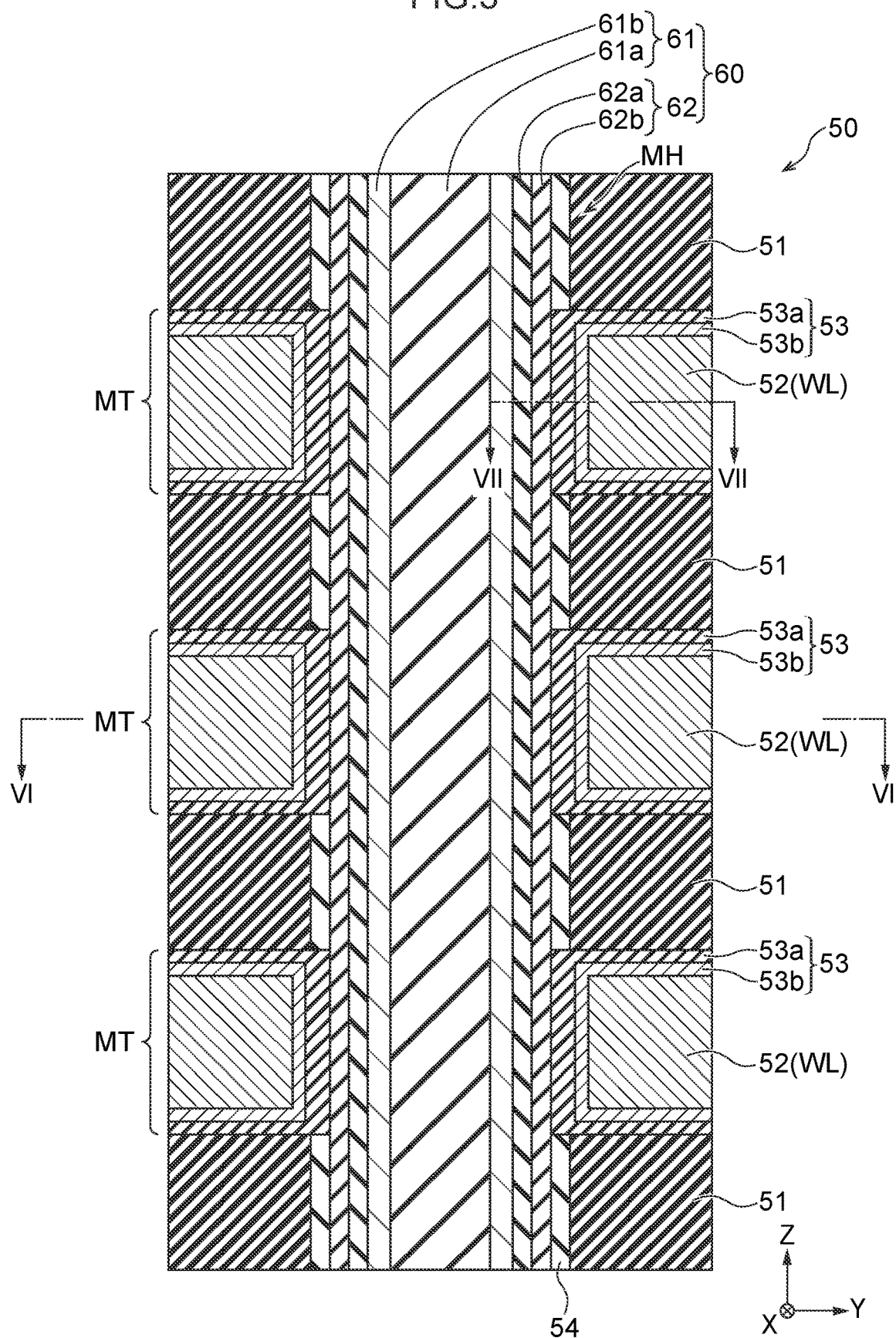
FIG. 5 is a cross-sectional view showing a sectional structure of a memory pillar of the embodiment.
Figure 6:
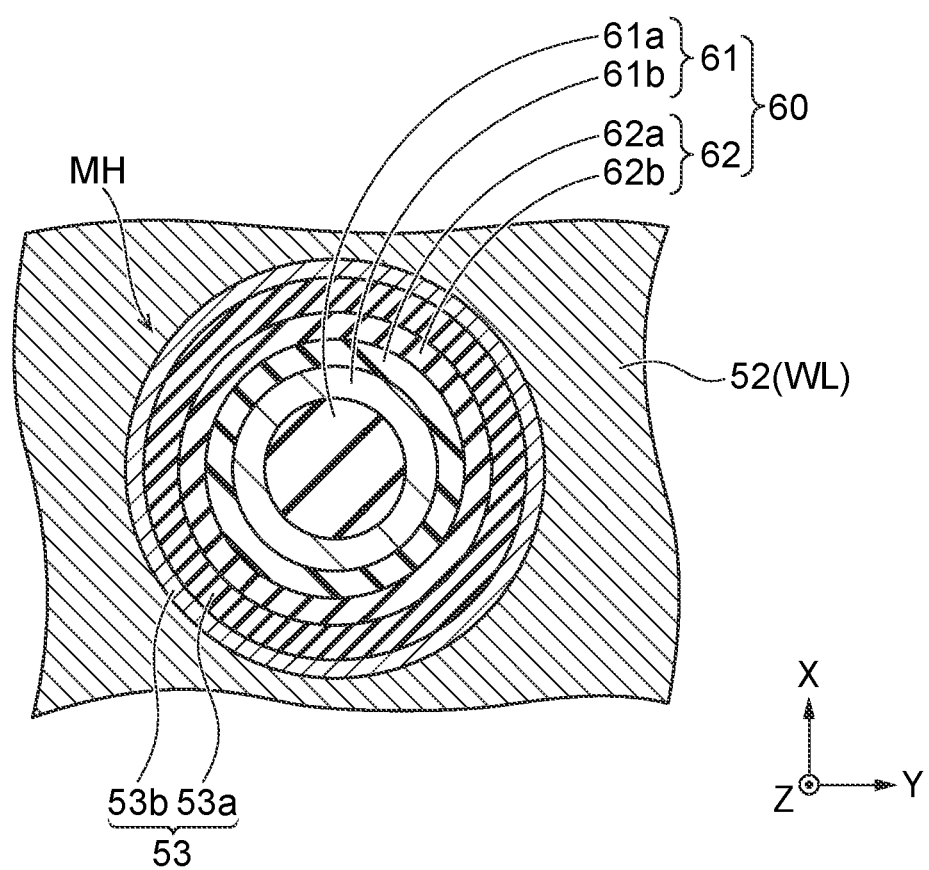
FIG. 6 is a cross-sectional view showing a sectional structure taken along a line VI-VI in FIG. 5.

FIG. 5 shows a sectional structure of the stacked body 50 taken by cutting one of the memory pillars 60 along a plane (a Y-Z plane) passing through its center axis. FIG. 6 shows a sectional structure along a line VI-VI in FIG. 5.

As shown in FIG. 6, the memory pillars 60 each have a circular or oval sectional shape. The memory pillars 60 each include a body 61 and a film lamination 62.

The body 61 includes a core portion 61a and a semiconductor portion 61b. The semiconductor portion 61b contains a semiconductor material and is formed of, for example, an amorphous silicon-containing material. The semiconductor portion 61b is a portion where channels of the memory cell transistors MT, etc., are formed. The core portion 61a is provided inside the semiconductor portion 61b. The core portion 61a is formed of an insulating material such as silicon oxide. Note that the body 61 may be provided by the semiconductor portion 61b as a whole without the core portion 61a inside.

The film lamination 62 is in the form of a multi-layer film formed such that it covers an outer periphery of the body 61. The film lamination 62 includes, for example, a tunnel insulating film 62a and a charge storage layer 62b. The tunnel insulating film 62a is provided on the outer periphery of the body 61. The tunnel insulating film 62a, for example, contains, for example, silicon oxide or silicon oxide and silicon nitride. The tunnel insulating film 62a is a potential barrier between the body 61 and the charge storage layer 62b. For example, in injecting electrons from the body 61 into the charge storage layer 62b (the writing operation), the electrons pass (tunnel) through the potential barrier of the tunnel insulating film 62a. In injecting holes from the body 61 into the charge storage layer 62b (the erasure operation), the holes pass through the potential barrier of the tunnel insulating film 62a.

The charge storage layer 62b is a film formed such that it covers an outside of the tunnel insulating film 62a. The charge storage layer 62b contains, for example, silicon nitride. The charge storage layer 62b has a trap site where charges are to be trapped in the film. Portions of the charge storage layer 62b sandwiched between the conductive layers 52 and the body 61 provide the charge storage layers in which charges are accumulated, in other words, storage regions of the memory cell transistors MT. A threshold voltage of the memory cell transistors MT varies with whether or not charges are in the charge storage layer 62b or the amount of the charges.

As shown in FIG. 5, an outer peripheral surface of the conductive layers 52 is covered by a block insulating film 53. The block insulating film 53 is a film for reducing back tunneling of charges from the conductive layers 52 toward the film lamination 62. The block insulating film 53 is formed of, for example, a material containing silicon oxide and aluminum oxide.

A cover insulating film 54 is provided between the insulator layers 51 and the charge storage layer 62b. The cover insulating film 54 contains, for example, silicon oxide. The cover insulating film 54 is a film for protecting the charge storage layer 62b from being etched during a replacement step of replacing sacrifice layers with the conductive layers 52. In a case where the replacement step is not used to form the conductive layers 52, no cover insulating film 54 may be provided.

In each of the memory pillars 60, portions positioned inside the conductive layers 52 function as transistors. In other words, in each of the memory pillars 60, a plurality of transistors are electrically connected in series along the longitudinal direction of the memory pillar 60. The conductive layers 52 are connected to gates of the respective transistors through the film lamination 62. The semiconductor portions 61b inside the transistors function as channels of the transistor.

Parts of the transistors arranged in series along the longitudinal direction of each of the memory pillars 60 function as the plurality of memory cell transistors MT shown in FIG. 3. Further, the transistors formed at both ends of the plurality of memory cell transistors MT arranged in series function as the select transistors STD and STS, respectively, shown in FIG. 3.

As shown in FIG. 4, the plurality of bit lines BL are provided above each of the memory pillars 60. The bit lines BL are each formed in the form of a linear wiring line extending in the X direction. The bit lines BL are disposed side by side in the Y direction. Upper ends of the memory pillars 60 are connected to the plurality of bit lines BL through contacts Cb. With such a structure, the semiconductor portion 61b of the memory pillars 60 are electrically connected to the bit lines BL.

The stacked body 50 is divided into a plurality of portions by a slit ST. The slit ST is a linear groove formed to extend along the Y direction in FIG. 4, and is formed deep sufficient to reach, for example, the semiconductive layer 42.

An upper portion of the stacked body 50 is divided by a slit SHE. The slit SHE is a shallow groove formed such that it extends in the Y direction. The slit SHE is formed deep sufficient to divide only one of the plurality of conductive layers 52 that is provided as the select gate line SGD.

The film lamination 62 is removed at a lower end portion of the memory pillars 60. Accordingly, a lower end portion of the semiconductor portion 61b is connected to the semiconductive layer 42. With such a structure, the semiconductive layer 42, which functions as the source line SL, is electrically connected to the channels of the transistors.

1.5 Structures of Conductive Layer and Block Insulating Film

Subsequently, the structures of each conductive layer 52 and each block insulating film 53 will be specifically described.

Figure 7:
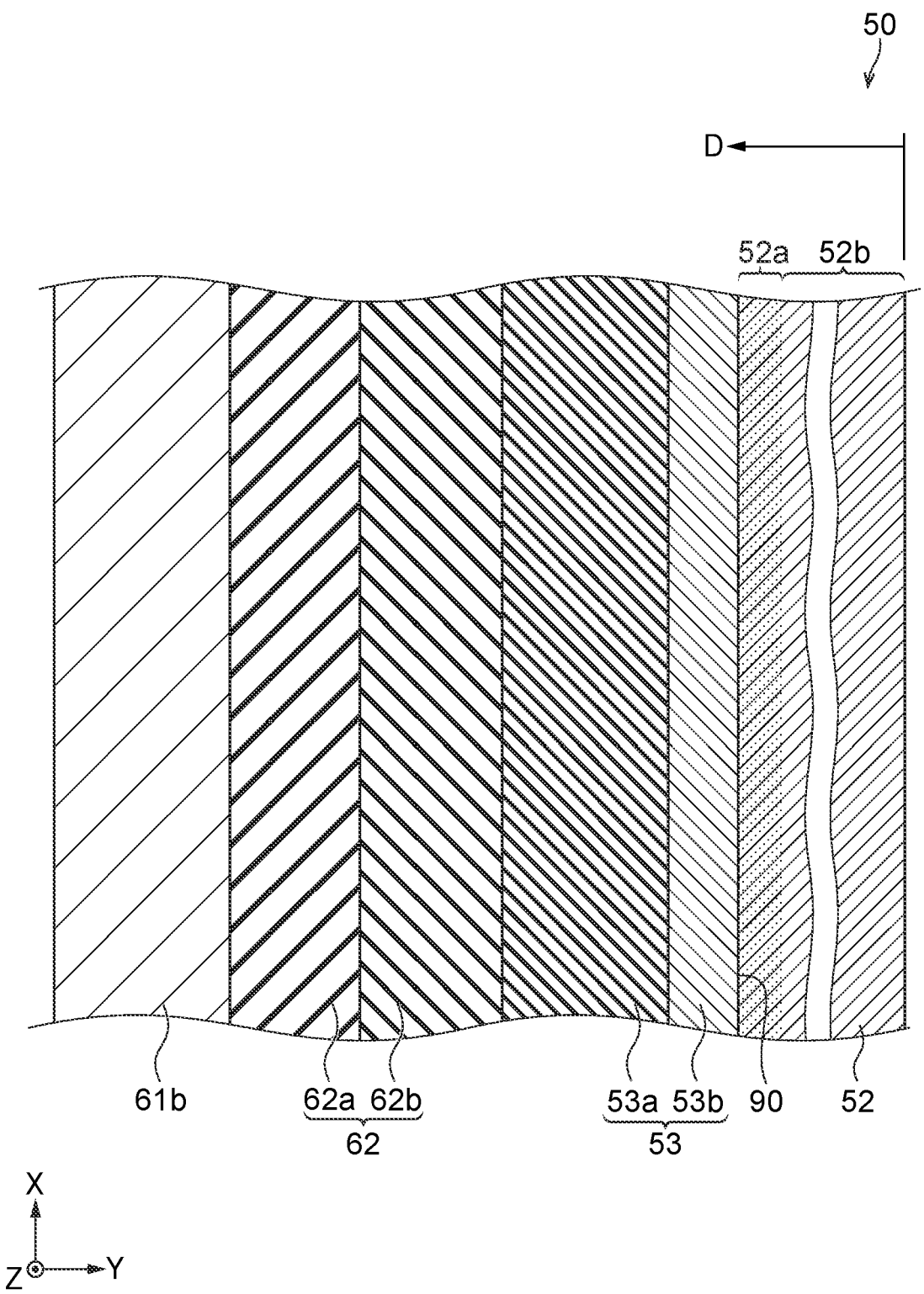
FIG. 7 is a cross-sectional view showing a sectional structure taken along a line VII-VII in FIG. 5.

As shown in FIG. 7, the block insulating film 53 has a double-layer structure of a silicon oxide film 53a and an aluminum oxide film 53b. The silicon oxide film 53a is provided in contact with the charge storage layer 62b. The silicon oxide film 53a is formed of, for example, a silicon-dioxide-containing material. The aluminum oxide film 53b is provided between the silicon oxide film 53a and the conductive layer 52. The aluminum oxide film 53b is formed of, for example, an aluminum-oxide-containing material. In the present embodiment, the silicon oxide film 53a corresponds to a first film, and the aluminum oxide film 53b corresponds to a second film.

A chlorine-rich portion 52a is provided at a portion at a predetermined thickness from a portion of the conductive layer 52 in contact with the block insulating film 53. The chlorine-rich portion 52a contains a larger amount of chlorine than the other portion 52b. Note that the boundary between the conductive layer 52 and the block insulating film 53 is illustrated as an interface 90. In the present embodiment, a portion 52b of the conductive layer 52 corresponds to a first portion. The chlorine-rich portion 52a of the conductive layer 52 corresponds to a second portion closer to the aluminum oxide film 53b than the first portion.

1.6 Semiconductor Device Manufacturing Method

Subsequently, a semiconductor device manufacturing method will be described.

Figure 8:
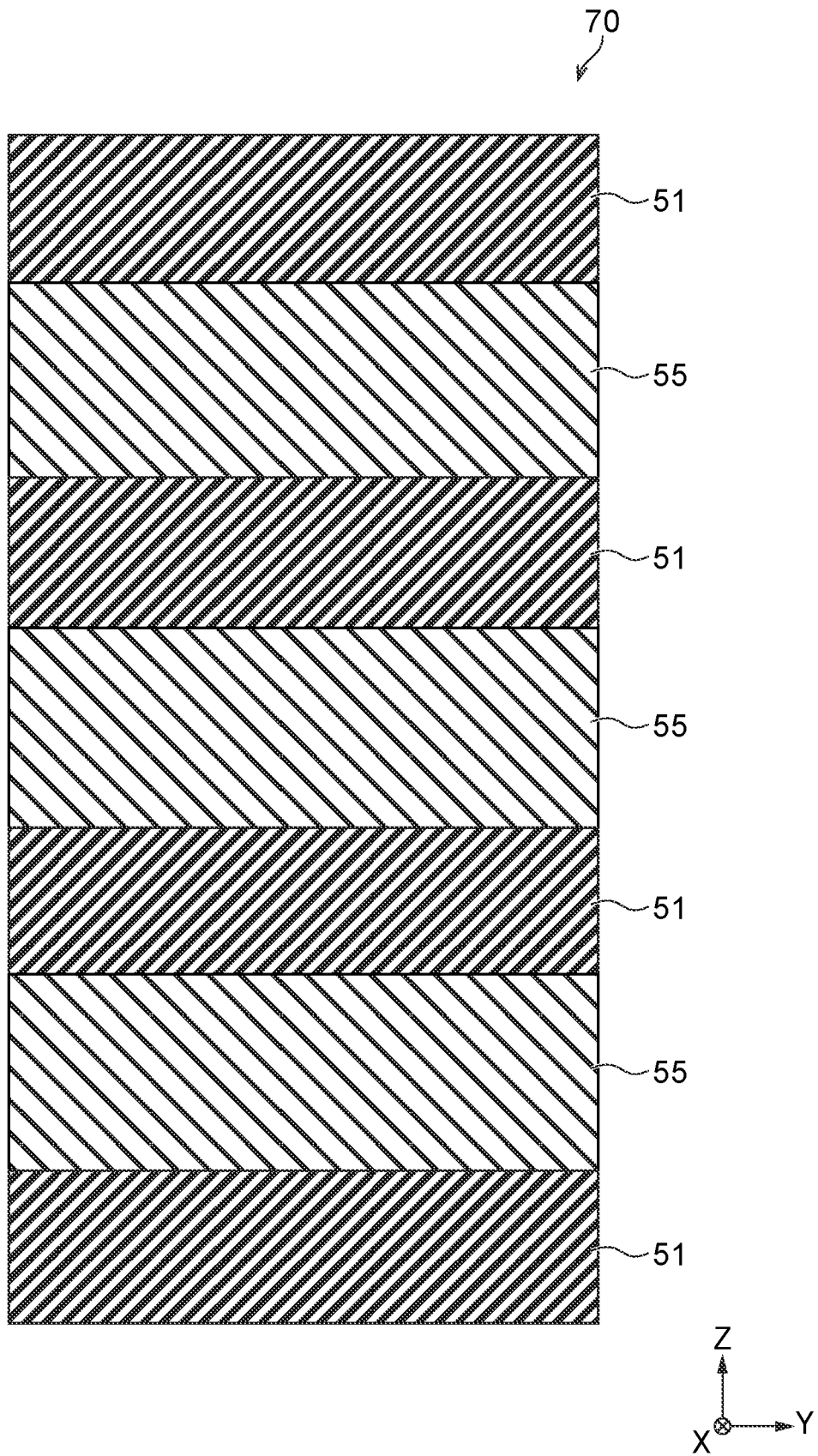
FIG. 8 is a cross-sectional view showing part of a manufacturing step of the semiconductor device of the embodiment.
Figure 9:
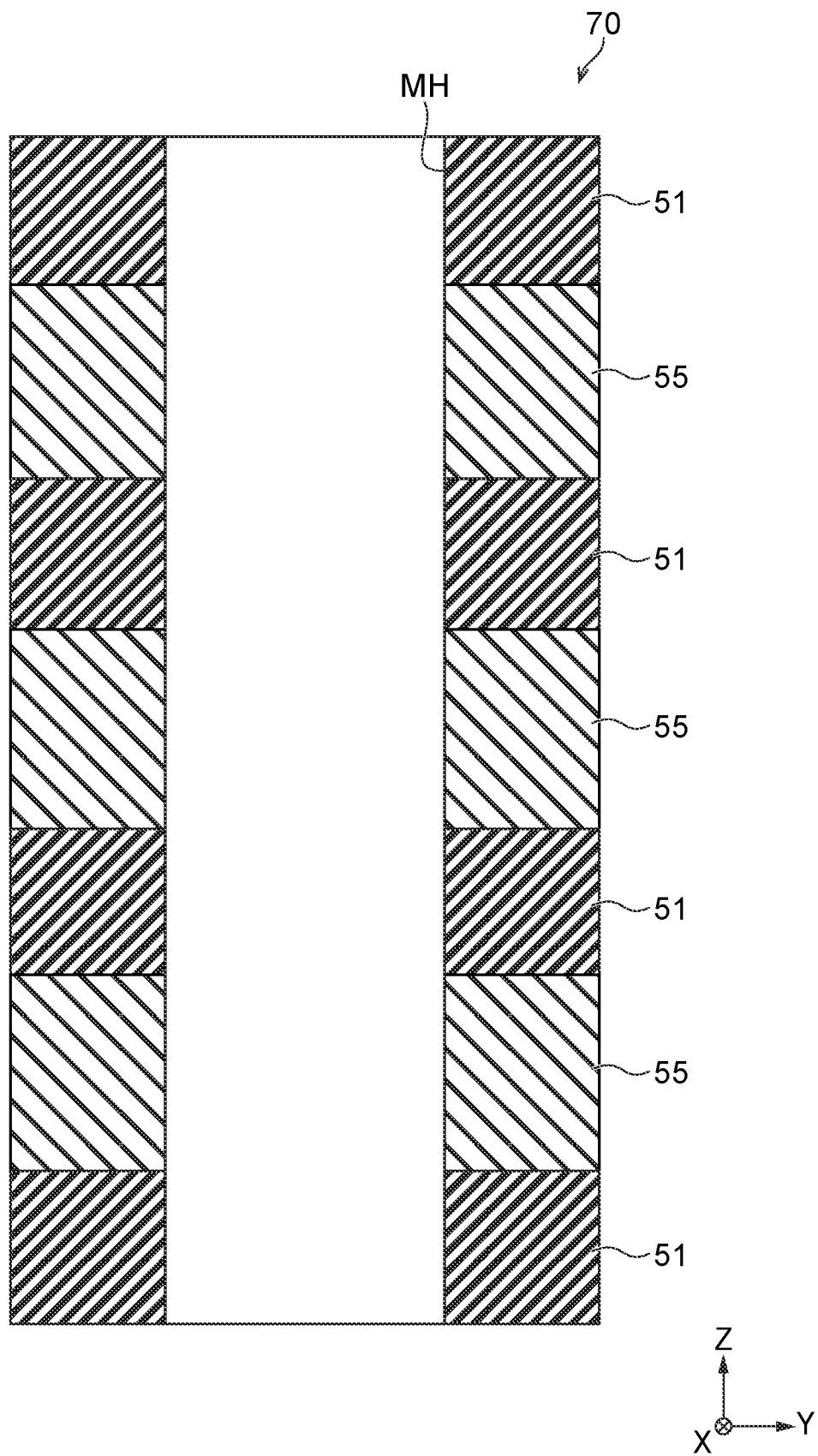
FIG. 9 is a cross-sectional view showing part of the manufacturing step of the semiconductor device of the embodiment.
Figure 10:
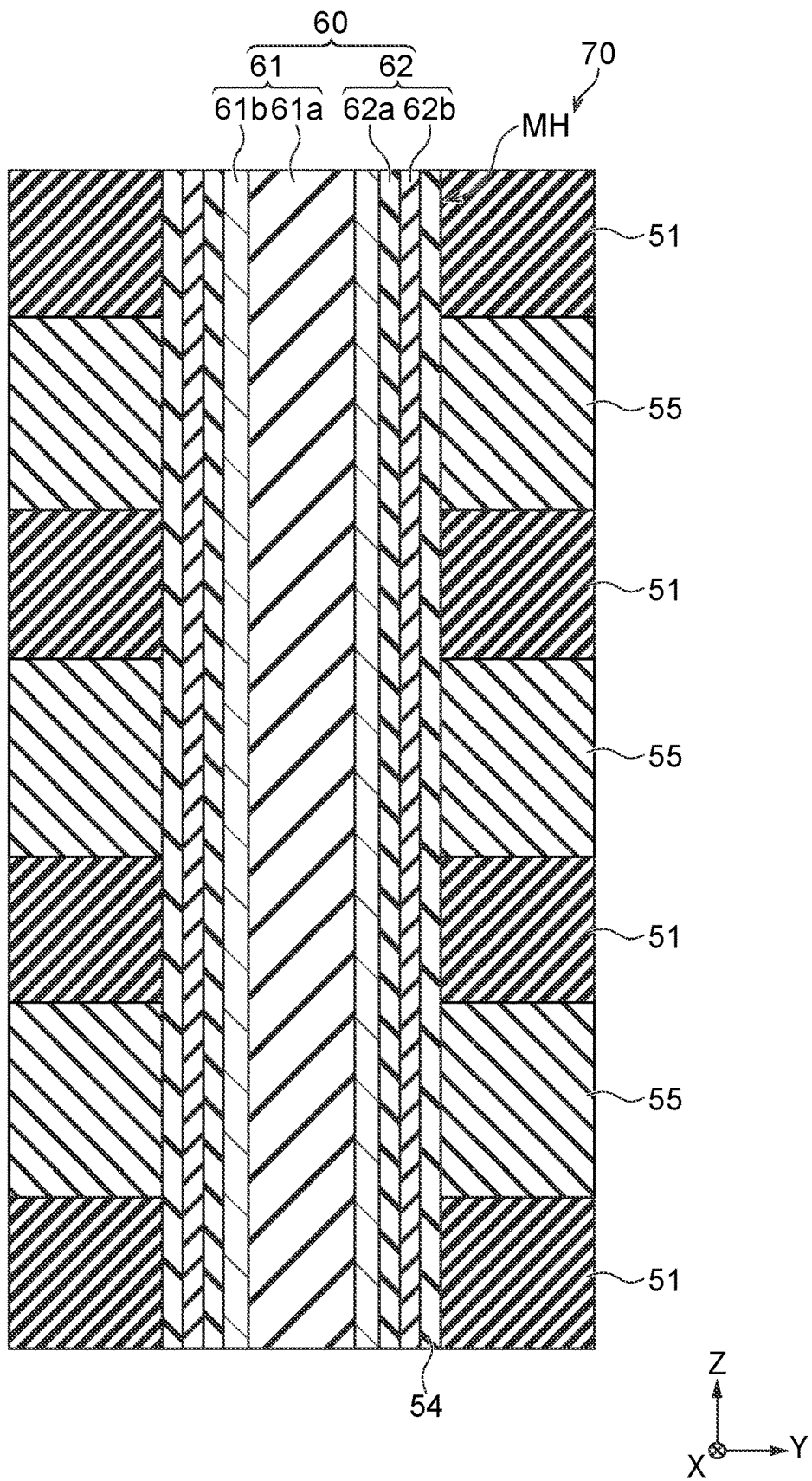
FIG. 10 is a cross-sectional view showing part of the manufacturing step of the semiconductor device of the embodiment.
Figure 11:
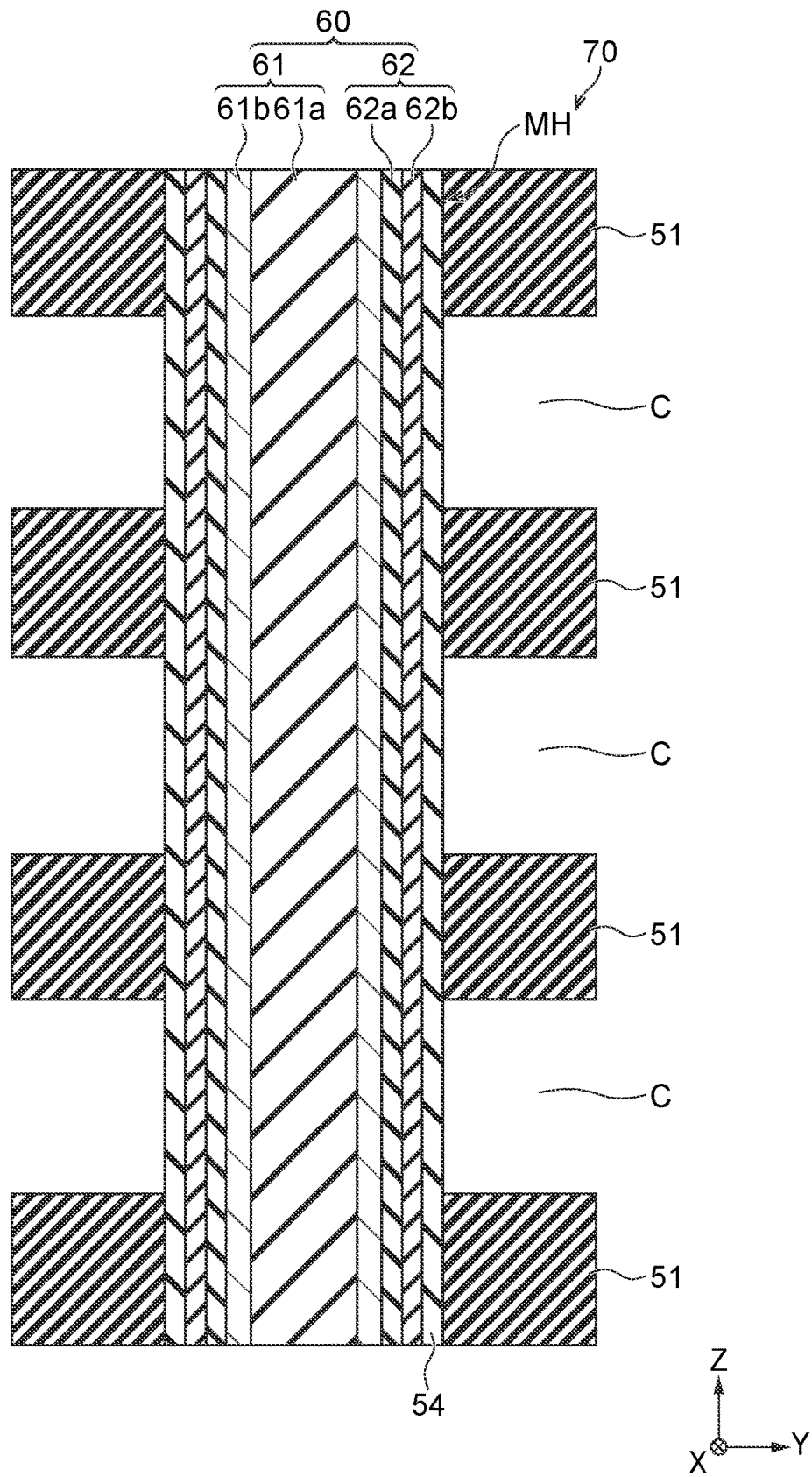
FIG. 11 is a cross-sectional view showing part of the manufacturing step of the semiconductor device of the embodiment.

As shown in FIG. 8, first, a stacked body 70 is formed by alternately laminating a plurality of insulator layers 51 and sacrifice layers 55 on a substrate (not shown) including an optional layer, and then a memory hole MH is formed through the stacked body 70 as shown in FIG. 9. Subsequently, as shown in FIG. 10, a cover insulating film 54, a charge storage layer 62b, a tunnel insulating film 62a, a semiconductor portion 61b, and a core portion 61a are sequentially formed on inner surfaces of the insulator layers 51 and the sacrifice layers 55 in the memory hole MH. Subsequently, a groove that is not shown is formed in the stacked body 70, and then used to remove the sacrifice layers 55 with drug solution such as phosphoric acid. Accordingly, as shown in FIG. 11, a hollow space C is formed between the insulator layers 51 and 51 adjacent to each other. Surfaces of the insulator layers 51 in the Z direction and a surface of the cover insulating film 54 are exposed in the hollow space C.

Figure 12:
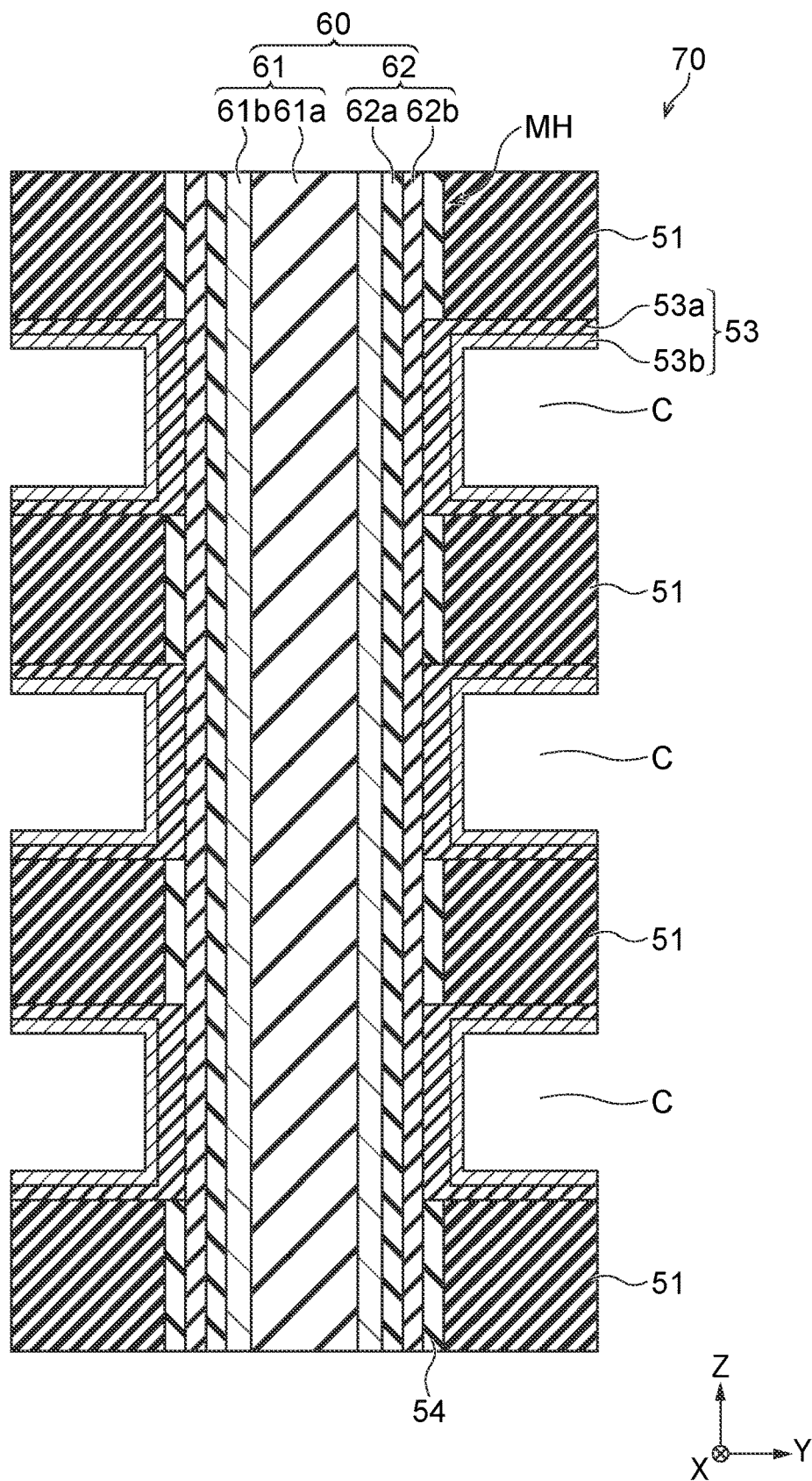
FIG. 12 is a cross-sectional view showing part of the manufacturing step of the semiconductor device of the embodiment.

Subsequently, the cover insulating film 54 exposed in the hollow space C is removed to expose a surface of the charge storage layer 62b in the Y direction, and then a silicon oxide film 53a and an aluminum oxide film 53b are sequentially formed on the surfaces of the insulator layers 51 in the Z direction and the surface of the charge storage layer 62b in the Y direction by using, for example, a thermal chemical vapor deposition (CVD) method or an atomic layer deposition (ALD) method. Accordingly, as shown in FIG. 12, a block insulating film 53 is formed in each hollow space C.

Figure 13:
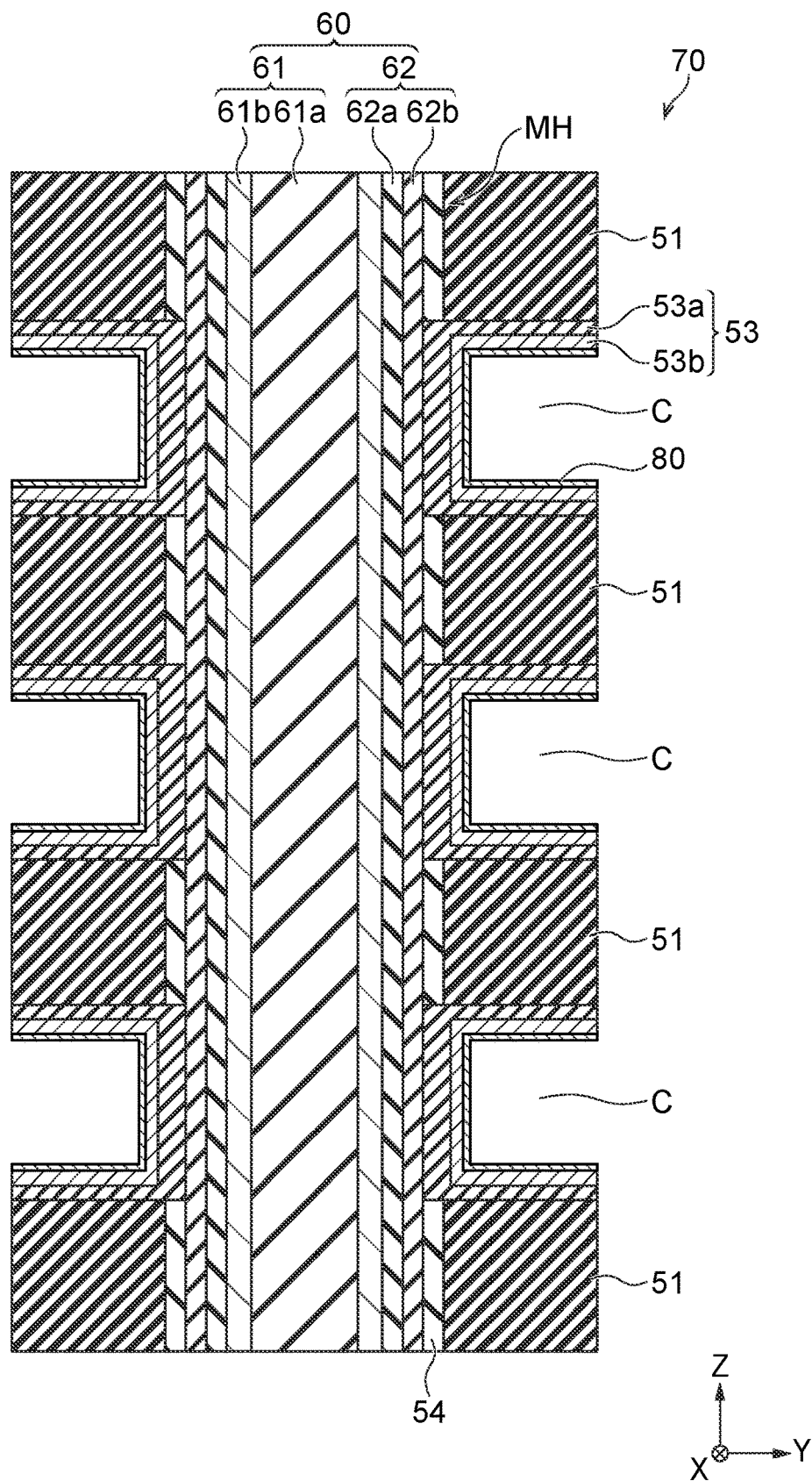
FIG. 13 is a cross-sectional view showing part of the manufacturing step of the semiconductor device of the embodiment.

Subsequently, as shown in FIG. 13, a molybdenum nitride (MoN) film 80 is formed on a surface of the aluminum oxide film 53b by using the ALD method. For example, the molybdenum nitride film 80 is formed on the surface of the aluminum oxide film 53b by causing $MoO_2Cl_2$ gas as material gas and ammonia ($NH_3$) gas as reduction gas to alternately flow into each hollow space C in an atmosphere at 300 [° C.] to 400 [° C.]. The molybdenum nitride film 80 has a favorable deposition property for the aluminum oxide film 53b. Thus, when the molybdenum nitride film 80 is formed on the surface of the aluminum oxide film 53b before formation of a molybdenum layer, which is the material of conductive layers 52, the molybdenum layer can be easily deposited on the aluminum oxide film 53b. Moreover, it is possible to reduce incubation of molybdenum deposition and improve coverage of molybdenum deposition.

Subsequently, a molybdenum layer is formed on a surface of the molybdenum nitride film 80 by using the ALD method. For example, the molybdenum layer is formed on a surface of the block insulating film 53 by causing $MoO_2Cl_2$ gas as material gas and hydrogen ($H_2$) gas as reduction gas to alternately flow into each hollow space C in an atmosphere at 600 [° C.] approximately. In this case, nitrogen contained in the molybdenum nitride film 80 deposited at a low temperature (300 [° C.] to 400 [° C.]) leaves the film in heating to a molybdenum deposition temperature (600 [° C.]). This obtains a structure in which only the molybdenum layer is formed on the aluminum oxide film 53b in appearance, and accordingly, molybdenum-containing conductive layers 52 as shown in FIG. 5 are formed. The molybdenum-containing conductive layers 52 are, for example, molybdenum layers containing metal molybdenum at 99 [atom %] or higher.

1.7 Chlorine Concentration in Conductive Layer and Aluminum Oxide Film

When the conductive layers 52 and the block insulating films 53 are formed by the manufacturing method as described above, chlorine contained in $MoO_2Cl_2$ gas used in the formation of the molybdenum nitride film 80 remains in the conductive layers 52 and the aluminum oxide films 53b, forming portions of high chlorine concentration in the conductive layers 52 and the block insulating films 53. For example, portions of high chlorine concentration are formed at portions where the molybdenum nitride film 80 has been formed in the conductive layers 52. This is because of the following reasons.

First, since the process of forming the molybdenum nitride film 80 is performed in an environment with a low temperature of 300 [° C.] to 400 [° C.], $MoO_2Cl_2$ molecules and ammonia molecules are less likely to react. Thus, chlorine is less likely to leave due to reaction at the portions where the molybdenum nitride film 80 has been formed. As a result, the amount of chlorine increases at the portions where the molybdenum nitride film 80 has been formed in the conductive layers 52.

In addition, ammonia is used as reduction gas in the process of forming the molybdenum nitride film 80. However, hydrogen is used as reduction gas in the process of forming the molybdenum-containing conductive layers 52. An ammonia molecule is less reactive to a $MoO_2Cl_2$ molecule than a hydrogen molecule. As a result, the amount of chlorine increases at the portions where the molybdenum nitride film 80 has been formed in the conductive layers 52.

Figure 14:
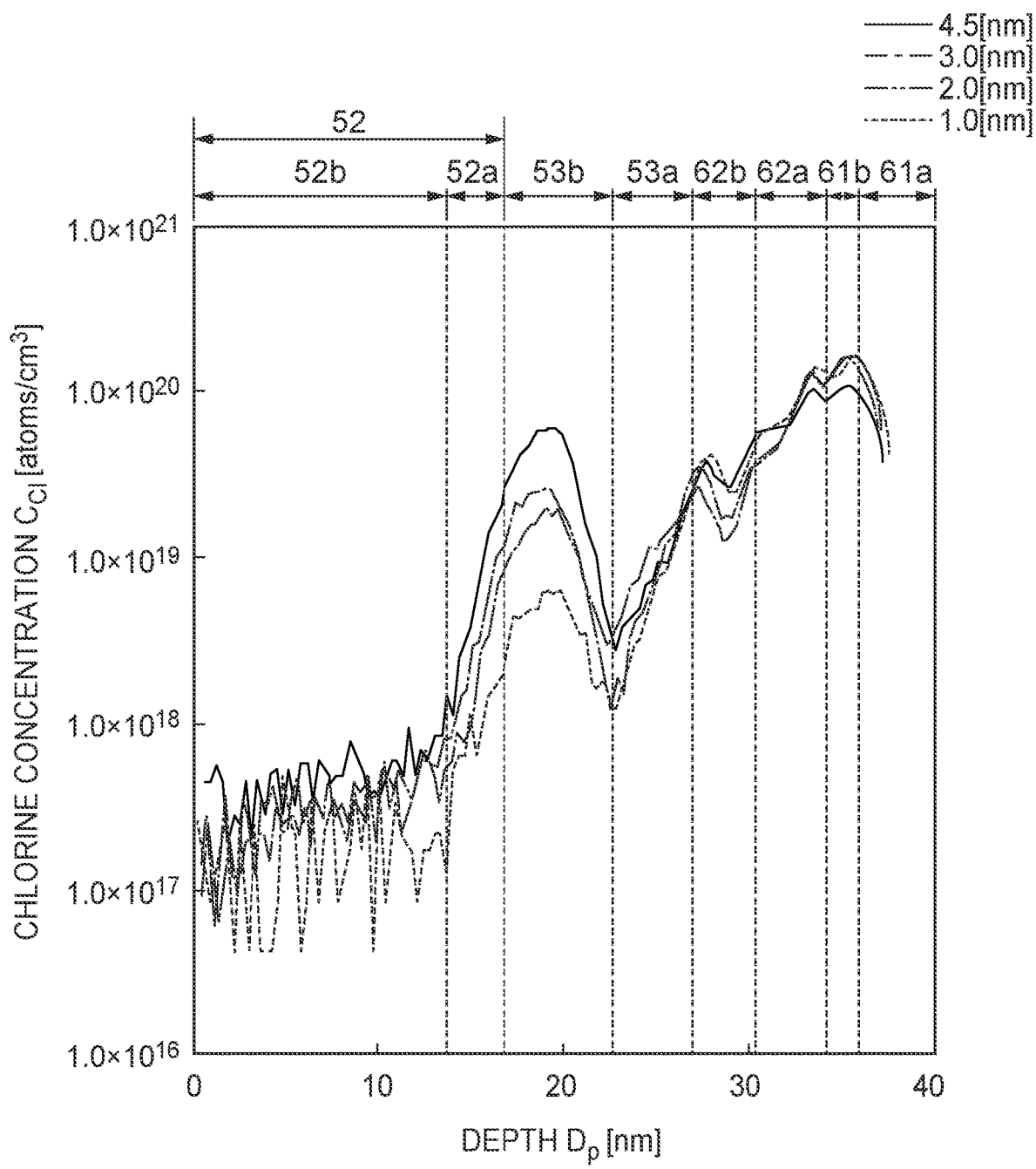
FIG. 14 is a graph showing the relation between a depth $D_p$ from an outer surface of a conductive layer and chlorine concentration $C_{Cl}$.

The inventors experimentally measured how much chlorine exists in the conductive layers 52 and the block insulating films 53 in the semiconductor device 2 of the embodiment. Specifically, when "$D_p$" represents a depth from an outer surface of each of the conductive layers 52 in the Y direction to an optional position inside the stacked body 50 as shown in FIG. 7, distribution of chlorine concentration $C_{Cl}$ at the depth $D_p$ was experimentally measured by secondary ion mass spectrometry (SIMS) analysis. The distribution of the chlorine concentration $C_{Cl}$ was measured for each of cases in which a thickness Tm of the molybdenum nitride film 80 after formation was 1.0 [nm], 2.0 [nm], 3.0 [nm], and 4.5 [nm], where "Tm" represents the thickness of the molybdenum nitride film 80 shown in FIG. 13. FIG. 14 is a graph of results of the experiment performed by the inventors.

As shown in FIG. 14, in the conductive layer 52, the chlorine concentration is high at a portion near the aluminum oxide film 53b, in other words, a portion where the molybdenum nitride film 80 has been formed. Thus, in the conductive layer 52, this portion where the chlorine concentration is high forms the chlorine-rich portion 52a. The chlorine concentration $C_{Cl}$ at the chlorine-rich portion 52a of the conductive layer 52 is higher than the chlorine concentration $C_{Cl}$ at the other portion 52b of the conductive layer 52.

In the aluminum oxide film 53b, a portion where the chlorine concentration is higher than that in the conductive layer 52 is formed. The inventors presume that this is because chlorine contained in $MoO_2Cl_2$ gas used in formation of the molybdenum nitride film 80 diffuses to the aluminum oxide film 53b.

In this manner, a portion where the chlorine concentration is high is formed in the conductive layer 52 or the aluminum oxide film 53b. For example, the chlorine concentration at the portion where the chlorine concentration is high may have a local maximum value in the aluminum oxide film 53b.

Figure 15:
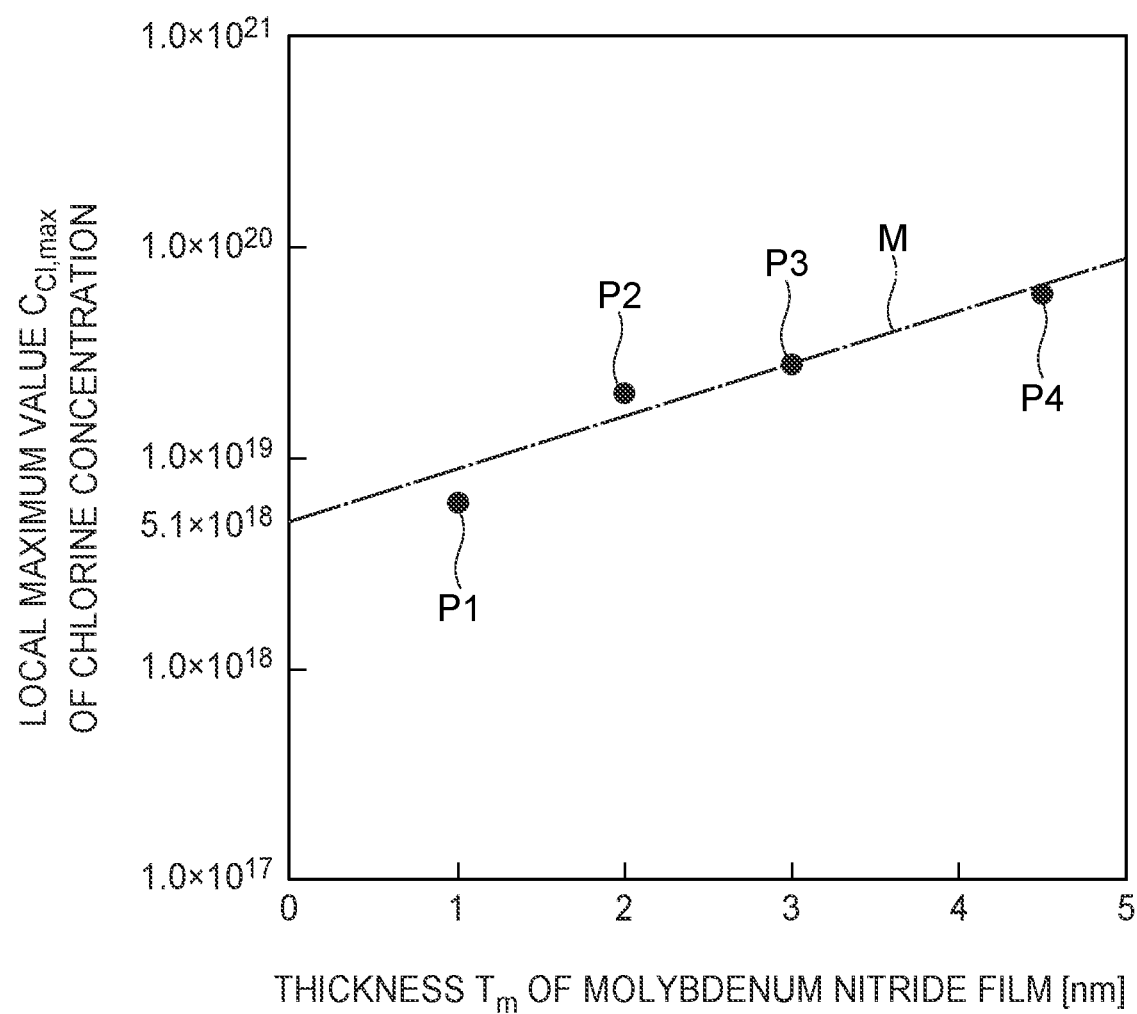
FIG. 15 is a graph showing the relation between a thickness Tm of a molybdenum nitride film and a local maximum value $C_{Cl,max}$ of the chlorine concentration.

As shown in FIG. 14, the local maximum value of the chlorine concentration $C_{Cl}$ changes in accordance with the thickness Tm of the molybdenum nitride film 80. FIG. 15 is a graph indicating the relation between the thickness Tm of the molybdenum nitride film 80 and the local maximum value $C_{Cl,max}$ of the chlorine concentration. Measurement points P1 to P4 shown in FIG. 15 correspond to cases in which the thickness Tm of the molybdenum nitride film 80 is 1.0 [nm], 2.0 [nm], 3.0 [nm], and 4.5 [nm], respectively. As shown in FIG. 15, the local maximum value $C_{Cl,max}$ of the chlorine concentration increases as the thickness Tm of the molybdenum nitride film 80 increases.

FIG. 15 also shows an extrapolation line M of the measurement point P1 to P4 in a dashed and single-dotted line. On the extrapolation line M, the local maximum value $C_{Cl,max}$ of the chlorine concentration is $5.1 \times 10^{18}$ [atoms/cm$^3$] when the thickness Tm of the molybdenum nitride film 80 is 0 [nm]. The local maximum value $C_{Cl,max}$ of the chlorine concentration corresponds to a value when the conductive layer 52 is formed without the molybdenum nitride film 80. In other words, the local maximum value $C_{Cl,max}$ of the chlorine concentration can be increased to a value larger than $5.1 \times 10^{18}$ [atoms/cm$^3$] by forming the conductive layer 52 after the molybdenum nitride film 80 is provided as described above.

1.8 Relation Between Chlorine Concentration and Data Retention Characteristic

Figure 16:
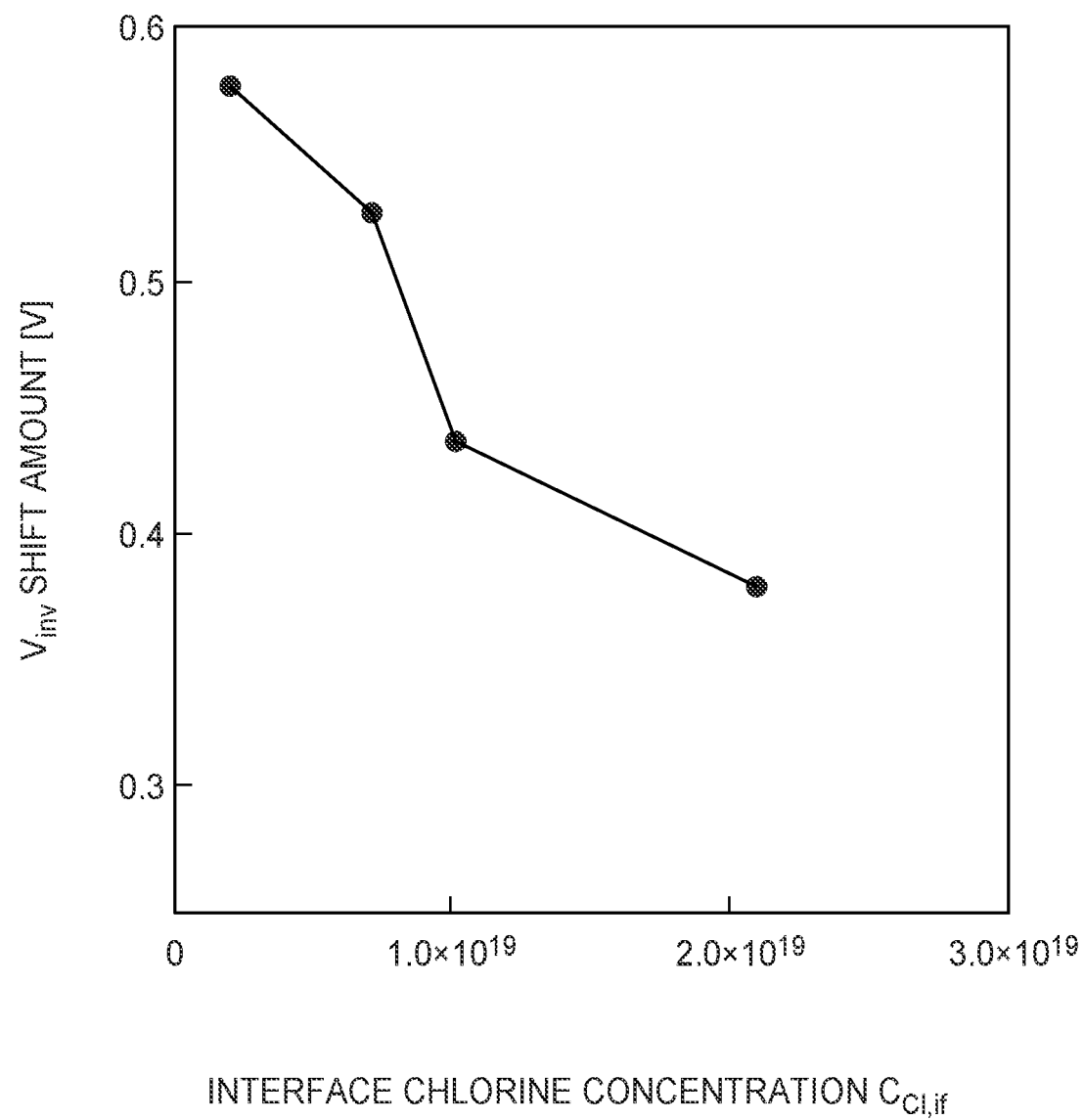
FIG. 16 is a graph showing the relation between interface chlorine concentration $C_{Cl,if}$ and a shift amount of a threshold voltage $V_{inv}$ of a charge storage layer.

The inventors experimentally determined the relation between chlorine concentration $C_{Cl,if}$ at the interface 90 between the conductive layer 52 and the block insulating film 53 shown in FIG. 7 and a shift amount of a threshold voltage $V_{inv}$ of the charge storage layer 62b. FIG. 16 is a graph of results of an experiment performed by the inventors. In the description below, the chlorine concentration $C_{Cl,if}$ at the interface between the conductive layer 52 and the block insulating film 53 is referred to as "interface chlorine concentration $C_{Cl,if}$".

As shown in FIG. 16, the shift amount of the threshold voltage $V_{inv}$ of the charge storage layer 62b decreases as the interface chlorine concentration $C_{Cl,if}$ increases. The shift amount of the threshold voltage $V_{inv}$ of the charge storage layer 62b is correlated with a high temperature data retention (HTDR) characteristic of the memory cell transistors MT. Specifically, the HTDR characteristic is more desirable as the shift amount of the threshold voltage $V_{inv}$ of the charge storage layer 62b is smaller. Thus, it can be understood from the graph shown in FIG. 16 that the HTDR characteristic of the memory cell transistors MT improves as the interface chlorine concentration $C_{Cl,if}$ increases. This is thought to be because what is called OH diffusion that hydrogen and oxygen diffuse to the silicon oxide film 53a through the conductive layer 52 is less likely to occur as the interface chlorine concentration $C_{Cl,if}$ increases. In particular, when the interface chlorine concentration $C_{Cl,if}$ is equal to or higher than $1.0 \times 10^{19}$ [atoms/cm$^3$], the HTDR characteristic of the memory cell transistors MT can be significantly improved. Note that the hydrogen and oxygen that diffuse in the OH diffusion include oxygen atoms, oxygen ions, hydrogen atoms, hydrogen ions, and OH molecules.

As described above, in the semiconductor device 2 of the present embodiment, a region from the conductive layer 52 to the aluminum oxide film 53b contains chlorine as impurities that reduce the OH diffusion. As shown in FIG. 14, the chlorine concentration $C_{Cl}$ at the chlorine-rich portion 52a in the conductive layer 52 is higher than the chlorine concentration $C_{Cl}$ at the portion 52b of the conductive layer 52. With this configuration, the OH diffusion from the conductive layer 52 to the silicon oxide film 53a can be reduced by chlorine at high concentration, and thus levels are unlikely to be formed in the silicon oxide film 53a. Accordingly, what is called charge missing that charges captured in the charge storage layer 62b escape to the silicon oxide film 53a is unlikely to occur, which can improve data retention as compared to conventional cases.

In the semiconductor device 2 of the present embodiment, the local maximum value $C_{Cl,max}$ of the chlorine concentration is higher than $5.1 \times 10^{18}$ [atoms/cm$^3$] as shown in FIG. 15. With this configuration, a larger amount of chlorine exists in the aluminum oxide film 53b than in a case in which the molybdenum nitride film 80 is not used in formation of the conductive layer 52, and thus the OH diffusion can be more accurately reduced. As a result, the data retention characteristic can be more accurately improved.

The chlorine concentration $C_{Cl,if}$ at the interface 90 between the conductive layer 52 and the block insulating film 53 is preferably equal to or higher than $1.0 \times 10^{19}$ [atoms/cm$^3$]. Accordingly, the shift amount of the threshold voltage $V_{inv}$ of the charge storage layer 62b can be further reduced as shown in FIG. 16, in other words, the data retention characteristic can be significantly improved.

2. Other Embodiments

The present disclosure is not limited to the above-described specific examples.

For example, the embodiment describes above the case in which the local maximum value $C_{Cl,max}$ of the chlorine concentration in the aluminum oxide film 53b is higher than $5.1 \times 10^{18}$ [atoms/cm$^3$], but instead, the chlorine concentration at the chlorine-rich portion 52a in the conductive layer 52 may be higher than $5.1 \times 10^{18}$ [atoms/cm$^3$].

Figure 17:
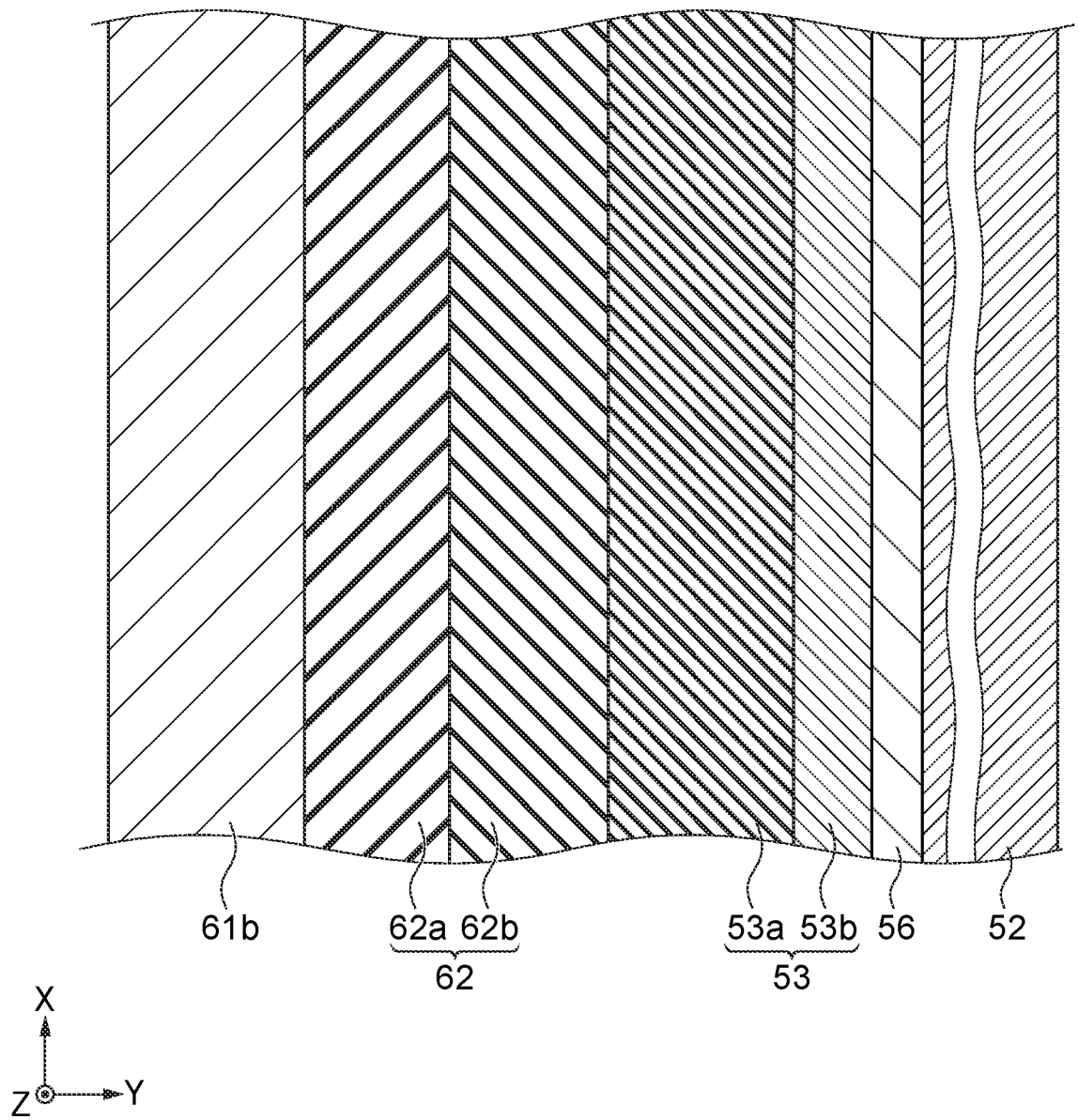
FIG. 17 is a cross-sectional view showing a sectional structure of a memory pillar of another embodiment near a conductive layer.

The chlorine concentration $C_{Cl}$ may have a local maximum value in the conductive layer 52. As shown in FIG. 17, a chlorine-rich film 56 may be additionally formed between the conductive layer 52 and the aluminum oxide film 53b such that the chlorine concentration $C_{Cl}$ has a local maximum value at a boundary portion between the conductive layer 52 and the aluminum oxide film 53b. In this example, the chlorine-rich film 56 corresponds to an impurity-rich layer. Moreover, the chlorine concentration $C_{Cl}$ may have no local maximum value and a portion where the chlorine concentration $C_{Cl}$ is high may exist near the interface 90 between the conductive layer 52 and the aluminum oxide film 53b. Furthermore, the chlorine concentration $C_{Cl}$ in the aluminum oxide film 53b may have no local maximum value and may have a slope, the value of which monotonically increases as the position approaches the silicon oxide film 53a.

Impurities that reduce the OH diffusion are not limited to chlorine but may be silicon, titanium, or the like. For example, when SiH$_4$ gas or SiH$_6$ gas is used as material gas, silicon can be added to the conductive layer 52 or the aluminum oxide film 53b. Note that, in this case, a silicon-containing film is formed in place of the molybdenum nitride film 80. Alternatively, when TiCl$_4$ gas is used as material gas, titanium can be added to the conductive layer 52 or the aluminum oxide film 53b. Note that, in this case, a titanium-containing film is formed in place of the molybdenum nitride film 80.

Embodiments of the present invention are described above, but these embodiments are presented as examples and not intended to limit the range of the invention. These novel embodiments may be performed in other various forms and provided with various kinds of omission, replacement, and change without departing from the scope of the invention. These embodiments and their modifications are included in the range and scope of the invention and also included in the range of the invention written in the claims and its equivalents.

What is claimed is:

1. A semiconductor device comprising:
   a stacked body that has a structure in which a plurality of conductive layers and a plurality of insulator layers are alternately stacked in a first direction, the plurality of conductive layers includes a first conductive layer;
   a channel extending the stacked body in the first direction;
   a charge storage layer provided between the channel and the first conductive layer; and
   a block insulating film provided between the charge storage layer and the first conductive layer, wherein
   the conductive layer contains molybdenum,
   the block insulating film includes:
      a first film provided in contact with the charge storage layer, and
      a second film provided between the first film and the first conductive layer,
   the first conductive layer and the second film contain impurities,
   a concentration of the impurities at a second portion of the first conductive layer that is closer to the second film than a first portion of the first conductive layer is higher than the concentration of the impurities at the first portion of the first conductive layer,
   a concentration of the impurities at a portion of the second film is higher than the concentration of the impurities at the second portion of the first conductive layer, and
   the block insulating film is provided in contact with the first conductive layer in the first direction and a second direction that is orthogonal to the first direction.

2. The semiconductor device according to claim 1, wherein the concentration of the impurities has a local maximum value in the first conductive layer.

3. The semiconductor device according to claim 1, wherein the concentration of the impurities has a local maximum value in the second film.

4. The semiconductor device according to claim 1, wherein the concentration of the impurities has a local maximum value at a boundary portion between the first conductive layer and the second film.

5. The semiconductor device according to claim 1, wherein the concentration of the impurities has a maximum value at a portion adjacent to the second film in the first conductive layer.

6. The semiconductor device according to claim 1, wherein an impurity-rich layer in which the concentration of the impurities is higher than in the first conductive layer and the second film is provided between the second film and the first conductive layer.

7. The semiconductor device according to claim 1, wherein the impurities are chlorine.

8. The semiconductor device according to claim 7, wherein the concentration of the chlorine at the second portion is higher than $1.0 \times 10^{18}$ [atoms/cm$^3$].

9. The semiconductor device according to claim 7, wherein the concentration of the chlorine at the second portion is higher than $5.1 \times 10^{18}$ [atoms/cm$^3$].

10. The semiconductor device according to claim 7, wherein the concentration of the chlorine at the first portion is equal to or lower than $1.0 \times 10^{18}$ [atoms/cm$^3$].

11. The semiconductor device according to claim 7, wherein the concentration of the chlorine at an interface between the first conductive layer and the second film is equal to or higher than $1.0 \times 10^{19}$ [atoms/cm$^3$].

12. The semiconductor device according to claim 1, wherein the impurities are silicon.

13. The semiconductor device according to claim 1, wherein the impurities are titanium.

* * * * *